United States Patent [19]

Muller et al.

[11] Patent Number: 4,879,467

[45] Date of Patent: Nov. 7, 1989

[54] APPARATUS FOR THE TRANSLATORY MANIPULATION OF AN ELEMENT SUCH AS AN AXLE

[75] Inventors: Jean F. Muller, Metz; Francois G. Tollitte, Verdun; Gabriel Krier, Metz; Serge Dominiak, Ars sur Moselle; Andre Eberhardt, Metz; Marcel Berveiller, Woippy, all of France

[73] Assignee: Universite de Metz, Metz, France

[21] Appl. No.: 249,573

[22] PCT Filed: Dec. 22, 1987

[86] PCT No.: PCT/FR87/00509

§ 371 Date: Aug. 23, 1988

§ 102(e) Date: Aug. 23, 1988

[87] PCT Pub. No.: WO88/04599

PCT Pub. Date: Jun. 30, 1988

[30] Foreign Application Priority Data

Dec. 23, 1986 [FR] France ............................... 86 18244

[51] Int. Cl.[4] ................. B01D 59/44; G01K 5/10; G01N 21/00
[52] U.S. Cl. .................. 250/288; 250/442.1; 250/443.1
[58] Field of Search ............ 250/281, 288, 442.1, 250/443.1; 269/71

[56] References Cited

U.S. PATENT DOCUMENTS

| 2,760,405 | 8/1956 | Frischmann . | |
|---|---|---|---|
| 3,403,575 | 10/1968 | Miller . | |
| 3,928,778 | 12/1975 | Ivanov et al. | 250/442.1 |
| 4,191,053 | 3/1980 | Hart et al. . | |
| 4,432,635 | 2/1984 | Mayer | 355/30 |
| 4,506,154 | 3/1985 | Scire | 250/442.1 |

FOREIGN PATENT DOCUMENTS

2032026 11/1970 France .
2547524 12/1984 France .
2562987 10/1985 France .

Primary Examiner—Bruce C. Anderson
Attorney, Agent, or Firm—Young & Thompson

[57] ABSTRACT

The present invention relates to an apparatus for translatory manipulation of an element, such as an axle.

Apparatus characterized in that it comprises a displacement device (2) for each direction in space in which the axle (1) is to be manipulated, each displacement device (2) comprising two blades (3) prestressed in opposition, constituted by an alloy which is pseudoelastic or has shape memory, disposed on opposite sides of heating and/or cooling means (4) giving rise to a thermal gradient between the two blades (3) and thus their martensitic transformation causing their deformation.

17 Claims, 3 Drawing Sheets

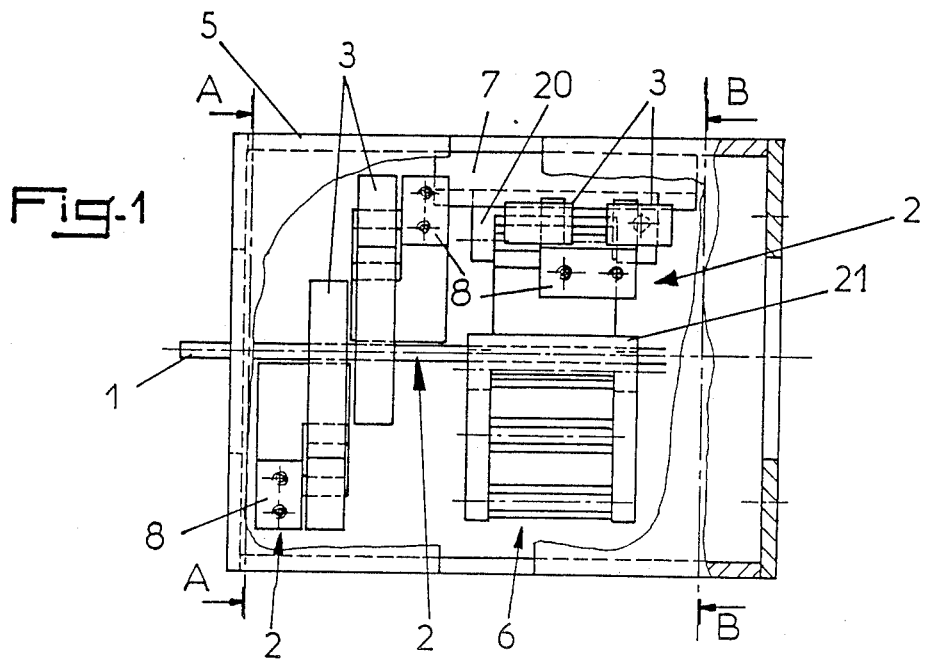
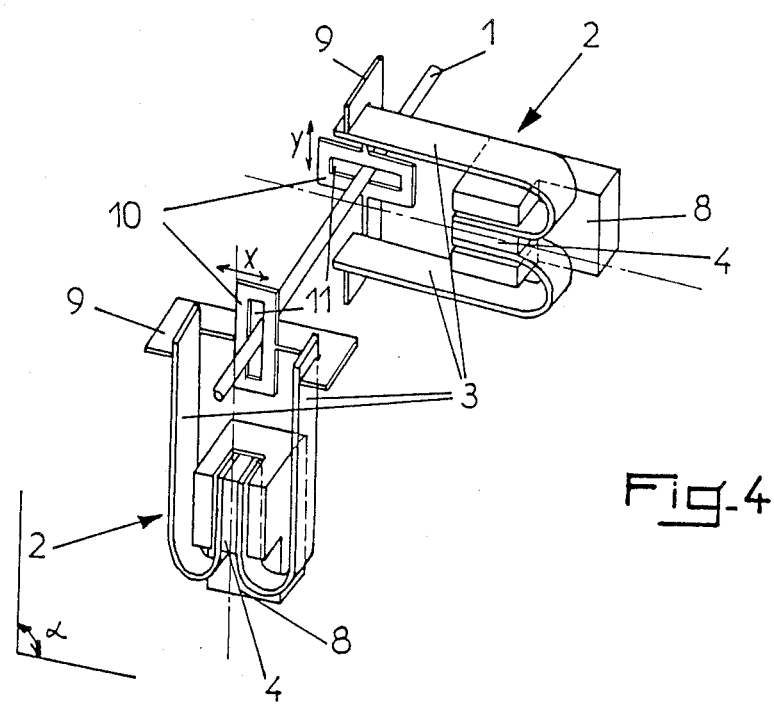

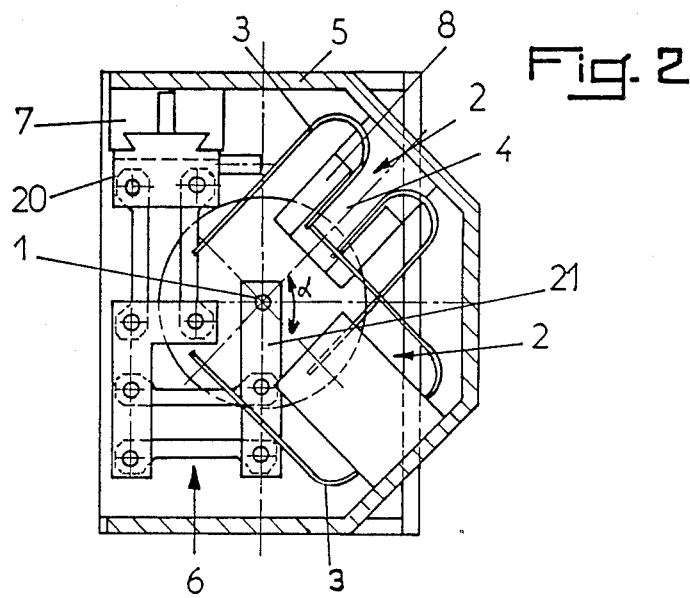
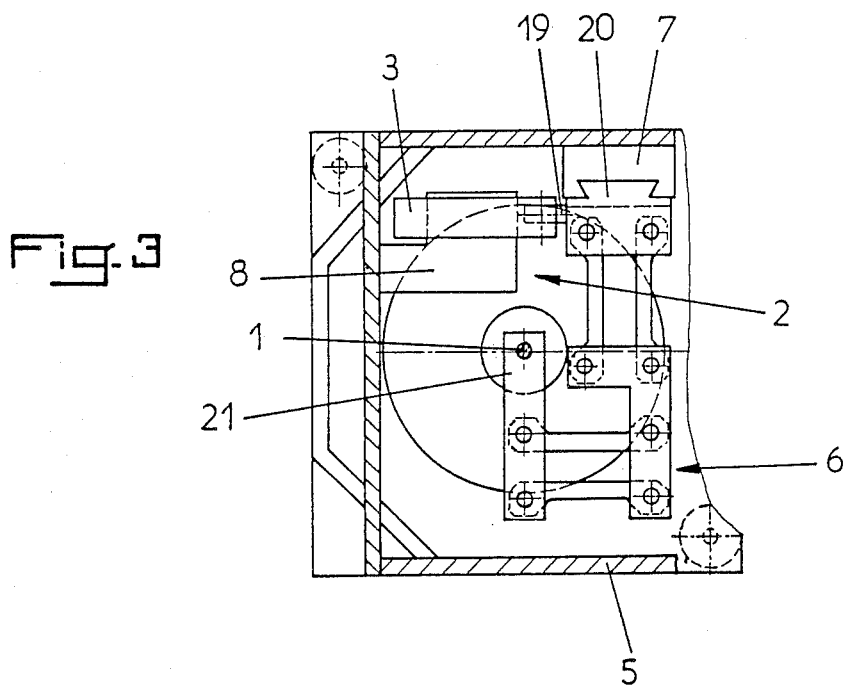

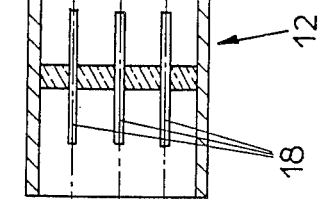
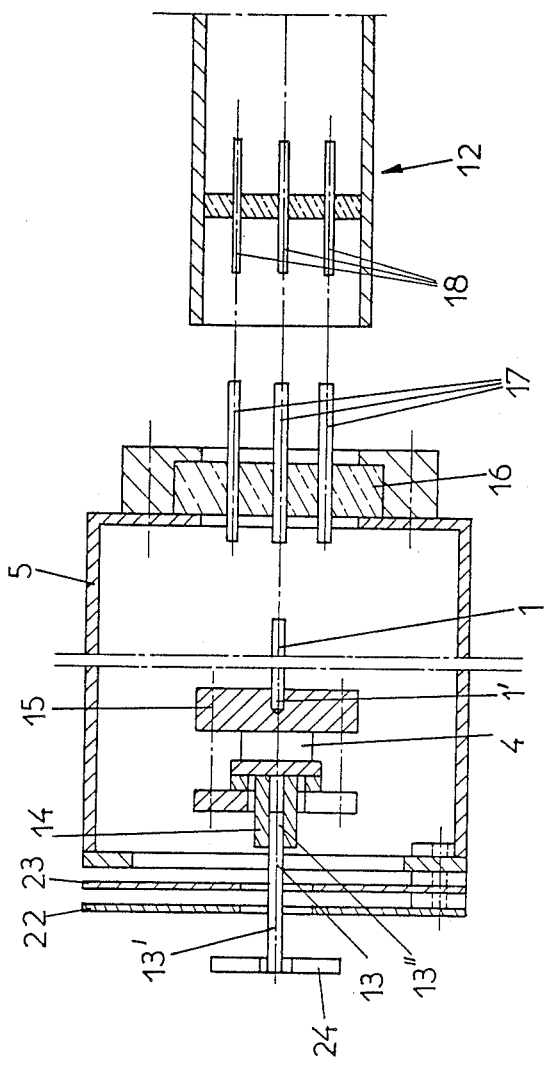
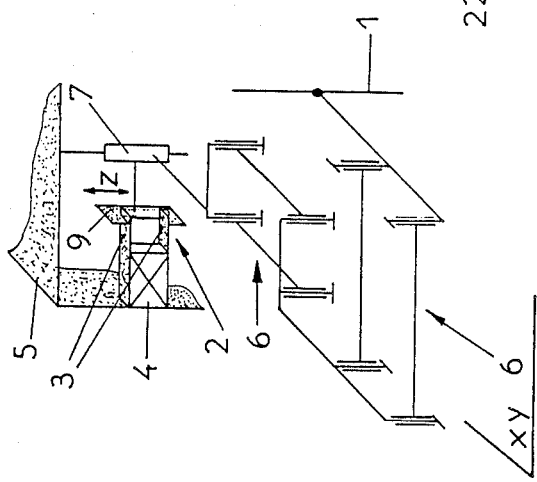

APPARATUS FOR THE TRANSLATORY MANIPULATION OF AN ELEMENT SUCH AS AN AXLE

The present invention relates to the field of apparatus for manipulation of an element, and has for its object such apparatus permitting the translation, in space, of an axle, for example, in a magnetic, electrical or high frequency field.

At present, there are utilized apparatus for the translatory manipulation in all manner of scientific fields, and for all manner of applications. When the manipulation apparatus is accessible, it can be controlled directly by the operator. For example, a microscope or a microsond can be directly manipulated, by micrometric screws or the like. But very often, the manipulatory apparatus is not accessible, because of working, for example, under vacuum or ultravacuum, as in the case of spectrometry, in a radioactive atmosphere in a nuclear environment, and more generally in any corrosive or noxious atmosphere, such as a high frequency field, a dangerous gas or a high temperature.

A mechanism for motion transfer is accordingly necessary, of the manual or automatic type. The known transfer mechanisms, of manual type, based on gears, levers, chains or the like, are very often heavy, voluminous, complicated and costly. Moreover, problems of tolerance and precision frequency arise. It is has thus been proposed to replace them by mechanisms of automatic types, controlled by micromotors controlled by microprocessors. But these micromotors function irregularly, upon working, for example, under vacuum, or in a magnetic, electrical or high frequency field. Serious problems of reliability and reproducibility result.

If therefore, as is very frequent, the manipulatory apparatus is inaccessible directly by the operator, and when working in a magnetic, electrical or high frequency field, there are used manual or automatic transfer mechanisms giving results that are not reproducible with a certain delay, by virtue of their lack of reliability.

The present invention has for its object to overcome these drawbacks.

It thus has for its object an apparatus for translatory manipulation, of an element such as an axle, characterized in that it comprises a device for displacing in each direction in space in which the axle is to be handled, each displacement device comprising two opposed prestressed strips, constituted by an alloy which is pseudoelastic or which has shape memory, disposed on opposite sides of a heating means and/or a cooling means giving rise to a thermal gradient between the two blades and thus their martensitic transformation giving rise to their deformation.

The invention will be better understood thanks to the following description, which relates to preferred embodiments given by way of non-limiting example, and explained with reference to the accompanying schematic drawings, in which:

FIG. 1 is a front cross sectional view of a manipulation apparatus according to the invention;

FIG. 2 is a cross sectional view, from the left, on line A—A of FIG. 1, of the manipulation apparatus according to the invention;

FIG. 3 is a cross sectional view from the right, on the line B—B of FIG. 1, of the manipulation apparatus according to the invention;

FIG. 4 is a perspective view of the two displacement devices permitting manipulation of the axle in a plane (x, y);

FIG. 5 is a schematic view in perspective of the displacement device permitting the manipulation of the axis in the direction (z), and FIG. 6 is a front cross sectional view of an apparatus for manipulation provided with a specimen holder mounted on a direct introduction rod of a mass spectrometer.

According to the invention, the manipulation apparatus comprises a displacement device 2 for each direction in space in which the axle is to be manipulated, each displacement device 2 comprising two opposed prestressed blades 3, constituted by an alloy which is pseudoelastic or which has shape memory, disposed on opposite sides of a heating means and/or cooling means 4 giving rise to a thermal gradient between the two blades 3 and thus their martensitic transformation involving their deformation. Such an apparatus is particularly suitable for manipulation in a magnetic, electrical or high frequency field.

The heating and/or cooling means 4 is preferably in the form of a Peltier effect cell.

As shown in FIG. 4, each displacement device 2 is in the form of a support 8 on which are fixedly mounted the Peltier effect cell 4 as well as the two blades 3, each in direct contact with one of the two sides of the Peltier effect cell 4, the two blades 3 being oppositely prestressed and maintained in opposite prestressed condition by a recessed and articulated blade 9 which secures them to each other, and being mounted in symmetrical opposition on opposite sides of support 8.

The Peltier cell 4, by its ceramic surfaces, plays the role of an electric insulator. Upon applying to this cell 4 an alternating current remotely controlled with the aid of a very sensitive potentiometer, one of these surfaces will become cold, while the other will become heated. The thermal heating of the blade 3 results in a diminution of the quantity of martensite and the cooling of the blade 3 produces an increase in the quantity of martensite, the ambient temperature $T_A$ being greater than the temperature $M_s$ at the beginning of martensitic transformation. There results an unbalance of force which results in a displacement of the recessed and articulated blade 9 and of the axle 1. Thus the stresses in such a material are a function of the deformation applied as well as its temperature. The cold blade 3 will elongate further from its initial condition, while the hot blade 3 will return toward it. The response times are of the order of a second. The thickness of the blades 3 of an alloy which is pseudoelastic with shape memory determines the intensity of the applied forces, and, as a result, the direction of the displacements, equally as a function of the length of the blades 3. The temperature difference depends, of course, on the type of Peltier cell used, but the temperature may in any event be easily controlled over a range between $-30°$ C. and $+100°$ C. The displacements themselves may be controlled by extensometric gauges disposed in the stressed region of the prestressed blades and calibrated as a function of the displacements.

The manipulative apparatus comprises a displacement device 2, for each direction in space in which the axle 1 is to be manipulated. If therefore it is desired to manipulate the axle 1 solely along the x axis, the chamber 5 of the manipulation apparatus will enclose a single displacement device 2. In this first embodiment, the axle 1 could be fixed directly on the recessed and articulated blade 9, the displacement of this latter, under the influence of the displacement of the two blades 3, resulting in the displacement of the axle 1 in one direction or the other along the axis x determined by the direction in which the blades 3 are prestressed. The axle 1 could be guided, during its manipulation, by guide means 6 in the form of a parallelogram linkage adapted to maintain two opposite sides perfectly parallel, or by guide means 7 in the form of a slideway, either dovetailed if operating under vacuum, or with roller balls if working in the atmosphere.

According to a second embodiment shown in FIG. 4, the housing 5 of the manipulation apparatus encloses two displacement devices 2 permitting the manipulation of the axle 1 in a plane x, y, the two devices 2 being located one above the other at an angle of 90° and the axle being maintained in the two recesses 11. Thus, each recessed and articulated blade 9 of a displacement device 2 is provided with an element 10, itself provided with a recess 11 in which slides the axle 1, and disposed in a plane perpendicular to that of the blade 9. The recess 11 could for example be rectangular.

Thus the simultaneous or sequential displacement of the blades 3 of each of the two displacement devices 2, one along the axis x, the other along the axis y, results in the displacement of the axle 1 in the plane x, y. The axle 1 could equally be guided, during its manipulation, by one or several guide means 6 or 7. The guide means 6 could also be in the form of a ball and socket joint (not represented in the accompanying drawings). This means will be used, for example, in the case of controlling the antennae plate of a missile.

According to a third embodiment shown in FIGS. 1 to 3 of the accompanying drawings, the housing 5 of the manipulation apparatus encloses three displacement devices 2 permitting manipulation of the axle 1 in three directions x, y, z, two devices 2 permitting the manipulation of the axle in the plane x, y and being located one above the other at an angle α of 90°, the axle 1 being maintained in the two recesses 11 and the third device 2 permitting the manipulation of the axle 1 along the axis z. The displacement in the plane x, y is ensured, as in the preceding embodiment, by means of two recesses 11 of the two perpendicular blades 9. The displacement along the z axis, by contrast, is ensured by means of a piece 19 directly secured on the blade 9. As shown in FIGS. 2 and 3 of the accompanying drawings, the axle 1 could be guided, during its manipulation in the plane x, y, by two guide means 6 in the form of two parallelogram linkages, and along the axis z by guide means 7 in the form of a dovetail slideway.

Of course, this slideway 7 could equally be one with ball bearings, particularly if the manipulation apparatus functions under atmospheric pressure and lubrication is possible.

As shown in FIGS. 2 and 3, the parallelogram linkages 6 are secured to each other and one of the members 7 of one of the parallelogram linkages 6 slides directly in the dovetail slideway 7, this member 20 being also connected to the member 19 (see FIG. 3). Thus, the possibility of rotation, on the one hand, about the axis z and, on the other hand, of the member 21 of the parallelogram linkage 6 about the axle 1, relative to the member 20, is ensured. There is thus obtained a translation in the plane x, y of the member 21 secured to the axle 1 relative to the member 20 which moves in the dovetail guideway 7 along the axis z. The axle 1 is thus manipulable in the three directions x, y, z in space.

Such a manipulation apparatus thus comprises no micromotor. This absence of a micromotor ensures a total absence of vibration. As a result, this apparatus is, for example, ideal for all types of microsond. Moreover, it is completely insensitive to all variations of ambient temperature. Thus, the martensitic transformation which involves the deformation of the blades 3 of a material which is pseudoelastic or has a shape memory, takes place only upon creation of a thermal gradient between the two blades 3, and not upon variation of the ambient temperature, the blades 3 being symmetrically disposed on opposite sides of support 8.

Finally, such a manipulation apparatus is completely insensitive to very strong magnetic fields, because it comprises no micromotor. This is the reason why it is completely satisfactory for use at the end of a rod for direct introduction as known in mass spectrometers, so as to ensure the microdisplacements in translation of a sample holder, the rod being provided itself with a rotation mechanism.

To do this, and as shown in FIG. 6, the manipulation apparatus, according to the third embodiment, comprises moreover a specimen holder 24 located outside the housing 5 in the form of a support casing and connected fixedly and removably to one of the two ends of the axle 1, the side of the support housing 5 opposite the specimen holder 24 being connected to a direct introduction rod 12 of the specimens into a mass spectrometer or any other apparatus, for example a photoelectronic spectrometer ESCA, an ionic microsond, an AUGER microsond, an electron microscope, etc. . . . Supplemental heating and/or cooling means 4 is disposed between the specimen holder 24 and the end 1' of the axle 1, so as to heat or cool the specimen holder 24.

As shown in FIG. 6, the specimen holder 24 is secured to a rod 13, at its end 13' located outside the support casing 5 and whose other end 13" is inserted into the interior of the support casing 5, in a support 14 of which one of the surfaces is fixed to the heating and/or cooling means 4 in the form of a Peltier effect cell, itself connected to the end 1' of axle 1 by a connection support 15 in which is inserted said end 1' of the axle 1.

The support 14 is preferably of copper, the surfaces of ceramic of the Peltier effect cell 4 playing the role of electrical insulation.

The axle 1 will thus be displaceable in the three directions x, y, z in space. The apparatus operating in vacuum, the side 7 will be a dovetail guide. On the other hand, in the case of vacuum, to minimize friction, the two blades 9 and thus the two recesses 11 ensuring the manipulation of the axle 1 in the plane x, y will be inclined at 45° relative to the direction of gravity, so as to balance the weight of the axle 1 itself which supports the specimen holder 24.

The specimens will not be longer and wider than 1 cm nor more than 4 mm in height, but can have any shape, being fixed by clips which slide in eight concentric grooves. The clips maintain the specimens by screw clamping. Two grills 22 and 23 mounted on insulators, as well as the specimen holder 24, may be carried at variable voltages.

According to a modification of the invention, the specimen holder 24 could also be in other forms, for example, in the form of a heating filament.

The electrical conductors are so constituted that, in the majority of their paths, they will be parallel to the axis x which coincides with the axis of a strong magnetic field (for example 2 to 7 Tesla). When they are not parallel to the axis z, they are connected two by two (for supply and return of current), so that they will compensate the Laplace forces.

The axle whose guidance will be described, is hollow for the passage of conductors of the Peltier effect cell 4.

The support casing 5, is itself connected to the direct introduction rod 4 by means of a sealed glass-metal passage 16 provided with metallic tubes 17 permitting the passage of the electrical contacts to the metallic rods 18 of the direct introduction rod 12.

The specimen holder 24 has six electrical contacts, and each of the displacement devices 2 has two of them, which brings the total number of electrical contacts to twelve.

The manipulation apparatus secured to the end of the direct introduction rod 12 may, by virtue of its reduced dimensions, be secured or adapted to any type of mass spectrometer, or any other apparatus, for example a photoelectronic spectrometer ESCA, an ionic microsond, an AUGER microsond, an electron microscope, etc., comprising an introduction collar whose diameter of opening is sufficient. For example, the length and width of the apparatus could be of the order of 6.5 cm, and the height of the order of 15 cm. The diameter of the opening of the introduction collar should accordingly be greater than 7 cm. The longitudinal, transverse or other securement may be effected by a standard knife edge collar, which ensures the desired fluidtightness when the manipulation apparatus operates under vacuum in the support casing 5. The mass spectrometer may operate by cyclotronic resonance, or, more conventionally, quadrupolarity, with a magnetic sector, with an electrostatic sector or any combination of these various types. It could equally be an X or RMN scanner or a laser or ionic microsond.

In the embodiments described above, the manipulation apparatus has for its purpose to displace an element 1, in the given case an axle 1.

But it follows that this apparatus may also be used for other applications.

Moreover, of course, the invention is not limited to the embodiments described and shown in the accompanying drawings. Modifications remain possible, particularly as to the constitution of the various elements, or by substitution of technical equivalents, without thus departing from the scope of protection of the invention.

We claim:

1. Apparatus for translatory manipulation, of an element (1), such as an axle, characterized in that it comprises a displacement device (2) for each direction in space in which the axle (1) is to be manipulated, each displacement device (2) comprising two blades (3) prestressed in opposition, constituted by an alloy that is pseudoelastic or has shape memory, disposed on opposite sides of heating and/or cooling means (4) giving rise to a thermal gradient between the two blades (3) and thus their martensitic transformation causing their deformation.

2. Manipulation apparatus according to claim 1, characterized in that the heating and/or cooling means (4) is in the form of a Peltier effect cell.

3. Manipulation apparatus according to claim 2 characterized in that each displacement device (2) is in the form of a support (8) on which are fixedly mounted the Peltier effect cell (4) as well as the two blades (3), each in direct contact with one of the two surfaces of the cell (4), the two blades (3) being prestressed oppositely and maintained in prestressed opposed relation by a recessed and articulated blade (9) securing them to each other, and being mounted in symmetric opposition on opposite sides of the support (8).

4. Manipulation apparatus according to claim 3, characterized in that the recessed and articulated blade (9) of a displacement device (2) is provided with an element (10), itself provided with a recess (11) in which slides the axle (1), and disposed in a plane perpendicular to that of the blade (9).

5. Manipulation apparatus according to claim 4, characterized in that it is principally constituted by a housing (5) enclosing two displacement devices (2) permitting manipulation of the axle (1) in a plane (x, y), the two devices (2) being situated one above the other at an angle ($\alpha$) of 90° and the axle (1) being maintained in the two recesses (11).

6. Manipulation apparatus according to claim 4, characterized in that it is principally constituted by a housing (5) enclosing three displacement devices (2) permitting manipulation of the axle (1) in three directions of space (x, y, z), two devices (2) permitting the manipulation of the axle (1) in the plane (x, y) and being located one above the other at an angle ($\alpha$) of 90°, the axle (1) being maintained in the two recesses (11), and the third device (2) permitting the manipulation of the axle (1) along the axis (z).

7. Manipulation apparatus according to claim 6, characterized in that for the application to the field of spectrometry, it comprises also a specimen holder (24) located outside the housing (5), in the form of a support casing, and connected fixedly and removably to one of the ends (1') of the axle (1), the side of the support casing (5) opposite the specimen holder (24) being connected to a spectrometer introduction rod (12) of the specimens.

8. Manipulation apparatus according to claim 7, characterized in that supplemental heating and/or cooling means (4) is disposed between the specimen holder (24) and the end (1') of the axle (1), so as to heat and/or cool the specimen holder (24).

9. Manipulation apparatus according to claim 8, characterized in that the specimen holder (24) is fixed to a rod (13), at its end (13') located outside the support casing (5) and whose other end (13") is inserted in the interior of the support casing (5), in a support (14) of which one of the surfaces is secured to the heating and/or cooling means (4) in the form of a Peltier effect cell, itself connected to the end (1') of the axle (1) by a connecting support (15) in which is inserted said end (1') of the axle (1).

10. Manipulation apparatus according to claim 9, characterized in that the support (14) is of copper, the ceramic surfaces of the Peltier effect cell (4) serving as electrical insulation.

11. Manipulation apparatus according to claim 7, characterized in that the specimen holder (24) is in the form of a heating filament.

12. Manipulation apparatus according to claim 7, characterized in that the support casing (5) is connected to the direct introduction rod (12) by means of a sealed glass-metal passage (16) provided with metallic tubes (17) permitting the passage of electrical contacts to the metallic rods (18) of the direct introduction rod (12).

13. Manipulation apparatus according to claim 1, characterized in that the axle (1) is guided, during its manipulation, by one or more guide means (6 and/or 7).

14. Manipulation apparatus according to claim 13, characterized in that each guide means (6) is in the form of a parallelogram linkage.

15. Manipulation apparatus according to claim 13, characterized in that each guide means (6) is in the form of a ball joint.

16. Manipulation apparatus according to claim 13, characterized in that each guide means (7) is in the form of a slideway either with a dovetail or with balls.

17. Manipulation apparatus according to claim 1, characterized in that it is principally constituted by a housing (5) enclosing a displacement device (2) permitting manipulation of the axle (1) along an axis (x).

* * * * *